(12) United States Patent
Moon et al.

(10) Patent No.: US 7,827,470 B2
(45) Date of Patent: Nov. 2, 2010

(54) METHOD OF DETECTING ERROR EVENT IN CODEWORD REPRODUCED BY PERPENDICULAR MAGNETIC RECORDING MEDIUM AND APPARATUS USING THE SAME

(75) Inventors: Jaekyun Moon, Minneapolis, MN (US); Jihoon Park, Minneapolis, MN (US); Jun Lee, Yongin-si (KR)

(73) Assignees: Regents of the University of Minnesota, Minneapolis, MN (US); Samsung Electronics Co., Ltd., Suwon-si (KR)

( * ) Notice: Subject to any disclaimer, the term of this patent is extended or adjusted under 35 U.S.C. 154(b) by 1428 days.

(21) Appl. No.: 11/242,874

(22) Filed: Oct. 5, 2005

(65) Prior Publication Data

US 2006/0085721 A1    Apr. 20, 2006

Related U.S. Application Data

(60) Provisional application No. 60/615,596, filed on Oct. 5, 2004.

(30) Foreign Application Priority Data

Dec. 3, 2004    (KR) .................... 10-2004-0101117

(51) Int. Cl.
*H03M 13/00*    (2006.01)
(52) U.S. Cl. ................................... 714/781
(58) Field of Classification Search .................. 714/781
See application file for complete search history.

(56) References Cited

U.S. PATENT DOCUMENTS

| | | | |
|---|---|---|---|
| 6,427,220 | B1 | 7/2002 | Vityaev |
| 6,732,328 | B1 | 5/2004 | McEwen et al. |
| 2002/0021517 | A1* | 2/2002 | Katayama et al. ............. 360/48 |
| 2003/0110196 | A1 | 6/2003 | Stein et al. |

FOREIGN PATENT DOCUMENTS

| | | |
|---|---|---|
| CN | 1446405 A | 10/2003 |
| CN | 1519845 A | 8/2004 |
| KR | 2001-0018400 A | 3/2001 |

OTHER PUBLICATIONS

Feng, W., et al., "On the Performance of Parity Codes in Magnetic Recording Systems", Global Telecommunications Conference, 2000. GLOBECOM '00. IEEE, Nov. 2000 p. 1877-1881 vol. 3, Marvell Semiconductor, Inc., Sunnyvale, CA.

* cited by examiner

*Primary Examiner*—Scott T Baderman
*Assistant Examiner*—Enam Ahmed
(74) *Attorney, Agent, or Firm*—Sughrue Mion, PLLC

(57) ABSTRACT

Apparatuses and methods for detecting error events in a codeword reproduced by perpendicular magnetic recording medium (PMR. The method includes: generating cyclic redundancy check (CRC) parity bits based on a generator polynomial for a source information sequence to be recorded on PMR medium and recording a codeword in which the generated CRC parity bits are added to the source information sequence; and reading the recorded codeword and an error event in the read codeword. It is possible to detect error events when a codeword recorded by PMR is read, using a small number of bits.

20 Claims, 8 Drawing Sheets

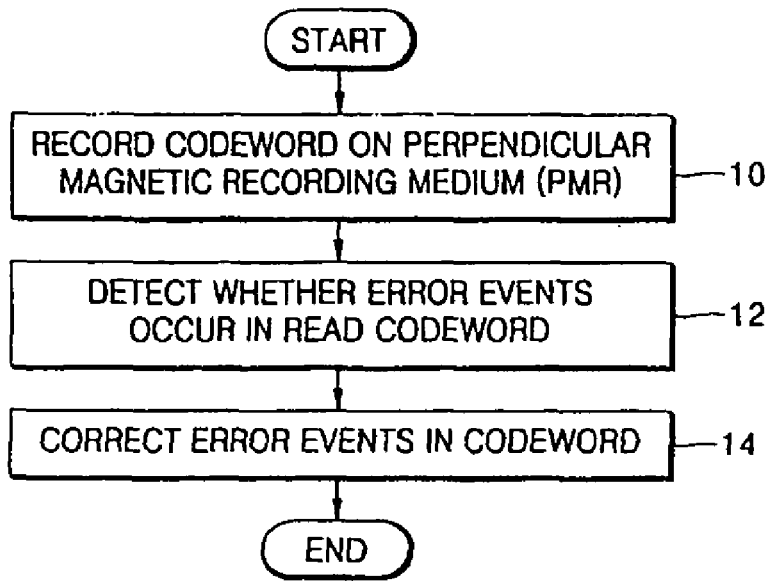
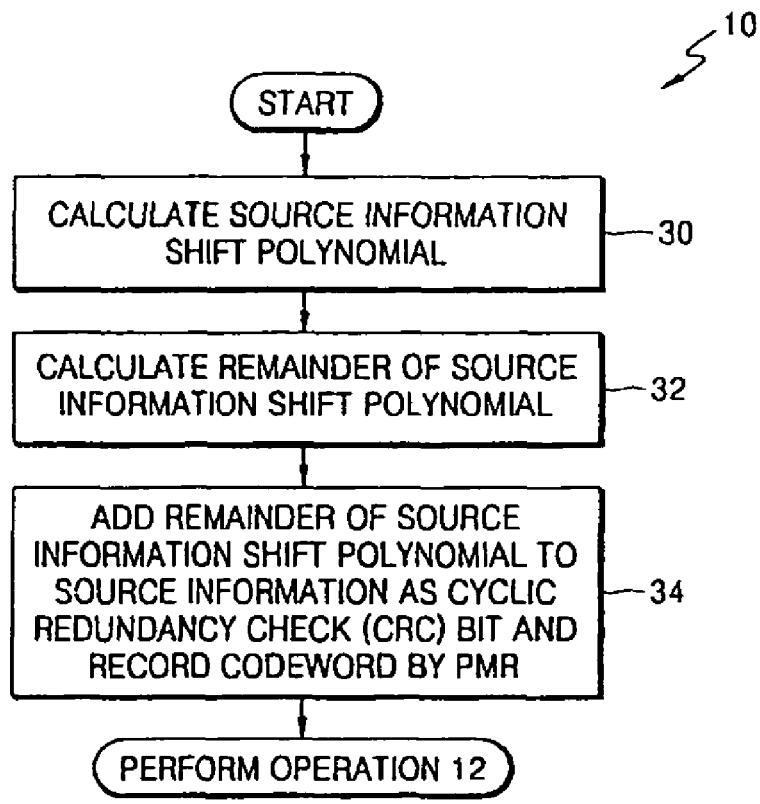

FIG. 5

| GENERATED ERROR EVENTS (UNCODED) | FREQUNCY | DETECTABILITY |
|---|---|---|
| 2 -2 | 67.72% | O |
| 2 -2 0 2 -2 | 16.54% | O |
| 2 -2 0 2 -2 0 2 -2 | 5.52% | O |
| 2 -2 0 0 2 -2 | 2.77% | O |
| DOMINANT ERROR EVENTS | 92.55% | |
| 2 -2 0 2 -2 2 | 0.79% | O |
| 2 -2 0 2 -2 2 -2 2 0 -2 2 | 0.79% | O |
| 2 -2 0 2 -2 0 2 -2 0 2 -2 | 0.79% | O |
| 2 -2 2 -2 0 2 -2 | 0.79% | O |
| 2 -2 0 2 -2 2 -2 0 2 -2 | 0.39% | O |
| 2 -2 0 2 -2 0 2 -2 0 2 -2 | 0.39% | 193 FAILURES |
| 2 -2 0 0 2 -2 0 2 -2 | 0.39% | O |
| 2 -2 0 2 0 -2 2 | 0.39% | O |
| 2 -2 2 -2 0 0 2 -2 0 2 -2 | 0.39% | O |
| 2 -2 0 2 -2 2 -2 2 -2 2 -2 2 -2 | 0.39% | O |
| 2 -2 2 -2 2 | 0.39% | O |
| 2 -2 2 -2 2 0 -2 2 | 0.39% | O |
| 2 -2 2 -2 | 0.39% | O |
| 2 -2 0 2 -2 2 -2 2 | 0.39% | O |
| 2 -2 0 2 -2 0 0 2 -2 | 0.39% | 1 FAILURE |
| NON-DOMINANT ERROR EVENTS | 7.45% | |

FIG. 6A

| [1, 6, 7, 2] TARGET, 50% MEDIUM NOISE | | | |
|---|---|---|---|
| GENERATED ERROR EVENTS (UNCODED) | FREQUNCY | DETECTABILITY $(1+X^2+X^3)$ | DETECTABILITY $(1+X^3+X^4)$ |
| 2 -2 | 63.64% | O | O |
| 2 -2 2 | 18.46% | O | O |
| 2 -2 2 -2 2 | 4.68% | O | O |
| 2 -2 2 -2 | 4.41% | O | O |
| 2 -2 0 2 -2 | 3.31% | O | O |
| DOMINANT ERROR EVENTS | 94.5% | | |
| 2 -2 2 -2 2 -2 | 1.38% | O | O |
| 2 -2 2 -2 2 -2 2 | 1.11% | 197 FAILURES | O |
| 2 | 0.56% | O | O |
| 2 -2 2 -2 2 -2 2 -2 | 0.56% | 1 FAILURE | O |
| 2 -2 0 2 -2 2 | 0.27% | O | O |
| 2 -2 0 2 -2 2 -2 | 0.27% | O | O |
| 2 -2 2 -2 2 0 -2 2 | 0.27% | O | O |
| 2 -2 2 -2 2 -2 2 -2 2 | 0.27% | 1 FAILURE | O |
| 2 -2 2 -2 2 -2 2 -2 2 -2 | 0.27% | 1 FAILURE | O |
| 2 -2 2 -2 0 2 -2 2 -2 2 -2 | 0.27% | 1 FAILURE | O |
| 2 -2 2 -2 2 -2 2 -2 2 -1 2 | 0.27% | 1 FAILURE | O |
| NON-DOMINANT ERROR EVENTS | 5.5% | | |

FIG. 6B

| [5, 6, 0, -1] TARGET, 90% MEDIUM NOISE | | | |
|---|---|---|---|
| GENERATED ERROR EVENTS (UNCODED) | FREQUNCY | DETECTABILITY $(1+X^2+X^3)$ | DETECTABILITY $(1+X^3+X^4)$ |
| 2 -2 2<br>2<br>2 -2<br>2 -2 2 -2<br>2 -2 2 -2 2<br>2 -2 2 -2 2 -2<br>2 -2 2 -2 2 -2 2 | 29.22%<br>27.15%<br>16.51%<br>13.28%<br>5.88%<br>3.23%<br>2.48% | O<br>O<br>O<br>O<br>O<br>O<br>197 FAILURES | O<br>O<br>O<br>O<br>O<br>O<br>O |
| DOMINANT ERROR EVENTS | 97.75% | | |
| 2 -2 2 -2 2 -2 2 -2<br>2 -2 2 -2 2 -2 2 -2 2<br>2 -2 2 0 -2 2 -2<br>2 -2 2 -2 2 -2 2 -2 2 -2<br>2 -2 2 -2 2 -2 2 -2 2 -2 2 -2 | 1.33%<br>0.38%<br>0.18%<br>0.18%<br>0.18% | 1 FAILURE<br>1 FAILURE<br>1 FAILURE<br>1 FAILURE<br>1 FAILURE | O<br>O<br>O<br>O<br>O |
| NON-DOMINANT ERROR EVENTS | 2.25% | | |

US 7,827,470 B2

METHOD OF DETECTING ERROR EVENT IN CODEWORD REPRODUCED BY PERPENDICULAR MAGNETIC RECORDING MEDIUM AND APPARATUS USING THE SAME

This application claims priority from Korean Patent Application No. 10-2004-0101117, filed on Dec. 3, 2004 in the Korean Intellectual Property Office, and U.S. Provisional Patent Application No. 60/615,596, filed on Oct. 5, 2004 in the U.S. Patent and Trademark Office, the disclosures of which are incorporated herein in their entirety by reference.

BACKGROUND OF THE INVENTION

1. Field of the Invention

Apparatuses and methods consistent with the present invention relate to an error detection code (EDC) for a perpendicular magnetic recording medium (PMR), and more particularly, to detecting error events generated when a codeword recorded by PMR is read.

2. Description of the Related Art

A parity check code (PCC) is used as an error detection method to determine whether a reproduced codeword contains error events. For example, PCC is used to detect error events when a codeword recorded on a longitudinal magnetic recording medium (LMR) is reproduced.

However, if PCC is used to detect error events when a codeword recorded on a perpendicular magnetic recording medium (PMR) is read, the error correction mechanism is degraded, as will be explained below.

The types of error events generated in PMR are considerably different from those in LMR.

FIGS. 1A and 1B are graphs illustrating the types of error events in LMR and PMR, respectively. As shown in FIGS. 1A and 1B, the types of error events generated in LMR are different from those generated in PMR as indicated by differences in Channel Density $D_s$ and Normalized Distance (dB) between the graphs. A method of detecting error events in LMR cannot be used to detect error events in PMR due to these differences. As such, for example, a code is required for detecting error events in PMR.

SUMMARY OF THE INVENTION

The present invention provides a method of detecting error events when a codeword reproduced by perpendicular magnetic recording (PMR) is read, using a cyclic redundancy check (CRC) code.

The present invention also provides an apparatus for detecting error events when a codeword reproduced by PMR is read, using a CRC code.

According to an aspect of the present invention, there is provided a method of detecting error events in a codeword reproduced by perpendicular magnetic recording medium (PMR), the method including: generating cyclic redundancy check (CRC) parity bits based on a generator polynomial for a source information sequence to be recorded on PMR medium and recording a codeword in which the generated CRC parity bits are added to the source information sequence; and reading the recorded codeword and an error event in the read codeword.

According to another aspect of the present invention, there is provided a apparatus of detecting error events in a codeword reproduced by perpendicular magnetic recording medium (PMR), the apparatus including: an information encoder generating CRC parity bits based on a generator polynomial for a source information sequence to be recorded on PMR medium and recording a codeword in which the generated CRC parity bits are added to the source information sequence; and an error detector reading the recorded codeword and detecting error events in the read codeword.

BRIEF DESCRIPTION OF THE DRAWINGS

The above and/or other aspects of the present invention will become more apparent by describing in detail exemplary embodiments thereof with reference to the attached drawings in which:

FIG. 2 is a flowchart illustrating a method of detecting error events when a codeword reproduced by PMR is read, according to an exemplary embodiment of the present invention;

FIG. 3 is a flowchart illustrating Operation 10 shown in FIG. 2;

FIG. 5 illustrates an example of types of error events detected by exemplary embodiments of the present invention;

FIGS. 6A and 6B illustrate error event detectability according to the generating polynomial of the CRC code;

DETAILED DESCRIPTION OF EXEMPLARY EMBODIMENTS OF THE INVENTION

Figure 1A:
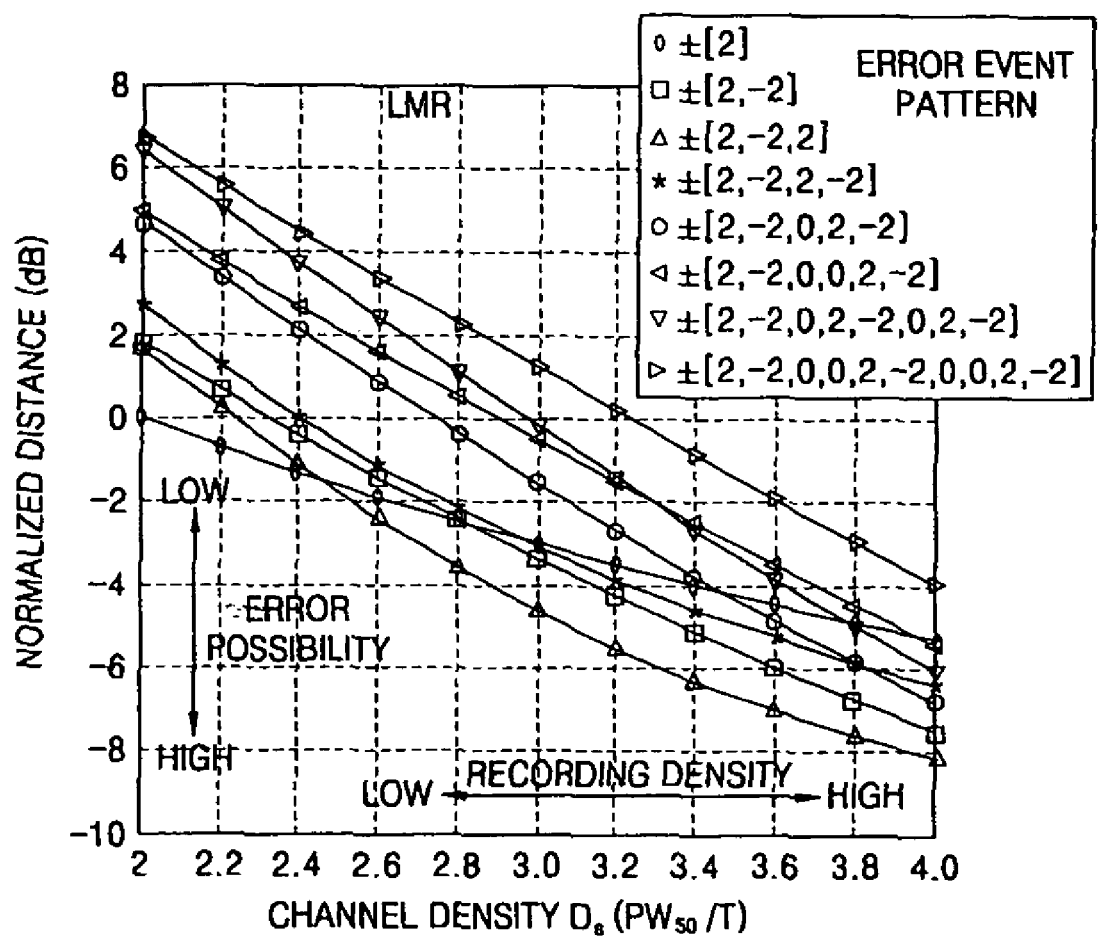
FIGS. 1A and 1B are graphs illustrating types of error events in longitudinal magnetic recording medium (LMR) and perpendicular magnetic recording medium (PMR), respectively.
Figure 1B:
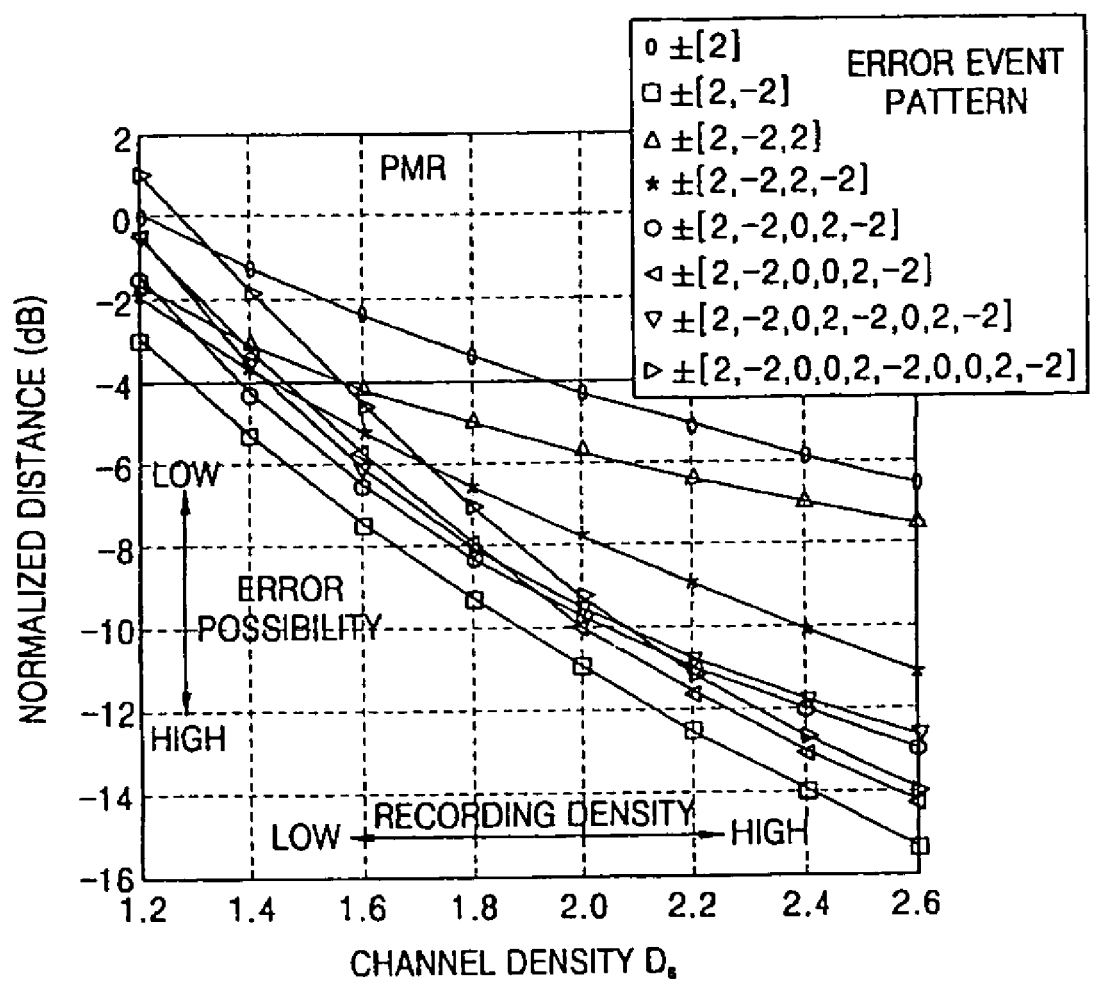

The present invention will now be described more fully with reference to the accompanying drawings, in which embodiments of the invention are shown.

FIG. 2 is a flowchart illustrating a method of detecting error events when a codeword reproduced by PMR is read, according to an exemplary embodiment of the present invention. Referring to FIG. 2, a cyclic redundancy check (CRC) bit is generated on the basis of source information to be recorded on a perpendicular magnetic recording medium (PMR), and a codeword to which is added the generated CRC bit is recorded by PMR (Operation 10). The codeword contains the source information and the CRC bit generated from the source information.

FIG. 3 is a flowchart illustrating Operation 10 shown in FIG. 2. Referring to FIG. 3, to add the CRC bit to the source information, a source information shift polynomial is calculated (Operation 30). The source information shift polynomial is calculated by multiplying a degree (i.e., a CRC bit number) equal to the degree of a generating polynomial by the source information. For example, when a bit stream of the source information is 1011, a descending polynomial $M(x)$ having the source information as a coefficient is given by $M(x)=x^3+x+1$. If $x^3$ is equal to the degree of the generating polynomial and is multiplied by the polynomial $M(x)$, the source information shift polynomial $N(x)$ is given by $N(x)=M(x) \times x^{3"}=x^6+x^4+x^3$.

The calculated source information shift polynomial is divided by a generating polynomial for materializing a CRC code to calculate remainders of the source information shift polynomial (Operation 32). The generating polynomial of the CRC code is used to generate the CRC code and detect error events in a reproduced codeword.

The generating polynomial is selected according to error event detection capability. When an error events polynomial having error events as a coefficient is divided by a specific generating polynomial, a specific generating polynomial in which a remainder of the error event polynomial is not 0 is used as the generating polynomial for implementing the CRC code. Error events in the codeword can be detected using a generating polynomial having a remainder other than 0. Error events in the codeword cannot be detected using a generating polynomial having a remainder of "0".

For example, if error events are 11011, an error event polynomial $E(x)$ for the error events is given by $E(x)=x^4+x^3+x+1$, and a specific generating polynomial $G(x)$ is given by $G(x)=x^2+x+1$. When the error event polynomial $E(x)$ is divided by the specific generating polynomial $G(x)$ to obtain a quotient and a remainder, the error event polynomial $E(x)$ is given by $E(x)=x^4+x^3+x+1=(x^2+1)(x^2+x+1)$ according to GF(2): Galois field arithmetic.

When the error event polynomial $E(x)$ is divided by the specific generating polynomial $G(x)=x^2+x+1$, since the remainder is 0, the error events 11011 cannot be detected using the specific generating polynomial $G(x)=x^2+x+1$. When a specific generating polynomial $G(x)$ is given by $G(x)=x^2+1$ and the error event polynomial $E(x)$ is divided by the specific generating polynomial $G(x)$ to obtain a quotient and a remainder, the error event polynomial $E(x)$ is given by $E(x)=x^4+x^3+x+1=(x^2+1)(x^2+x+1)$. When the error event polynomial $E(x)$ is divided by the specific generating polynomial $G(x)=x^2+1$ to obtain a quotient and a remainder, since the remainder is 0, the error events 11011 cannot be detected using the specific generating polynomial $G(x)=x^2+1$.

When a specific generating polynomial $G(x)$ is given by $G(x)=x^3+x^2+1$ and the error event polynomial $E(x)$ is divided by the specific generating polynomial $G(x)$ to obtain a quotient and a remainder, the error event polynomial $E(x)$ is given by $E(x)=x^4+x^3+x+1=x(x^3+x^2+1)+1$. When the error event polynomial $E(x)$ is divided by the specific generating polynomial $G(x)=x^3+x^2+1$ to obtain a quotient and a remainder, since the remainder is 1, the error events 11011 can be detected using the specific generating polynomial $G(x)=x^3+x^2+1$. When a specific generating polynomial $G(x)$ is given by $G(x)=x^3+x+1$ and the error event polynomial $E(x)$ is divided by the specific generating polynomial $G(x)$ to obtain a quotient and a remainder, the error event polynomial $E(x)$ is given by $E(x)=x^4+x^3+x+1=(x+1)(x^3+x+1)+x^2+x$. When the error event polynomial $E(x)$ is divided by the specific generating polynomial $G(x)=x^3+x+1$ to obtain a quotient and a remainder, since the remainder is $x^2+x$, the error events 11011 can be detected using the specific generating polynomial $G(x)=x^3+x+1$.

In the exemplary embodiment, Equation 1 or Equation 2 below may used as a generating polynomial for implementing the CRC code over a wide range of recording densities and different noise environments in PMR.

$$G(x)=x^3+x^2+1 \quad (1)$$

$$G(x)=x^4+x^3+1 \quad (2)$$

wherein $G(x)$ is the generating polynomial for implementing the CRC code, and x is a parameter indicating a 1-bit delay.

For example, when the source information shift polynomial given by $N(x)=M(x)*x^{3"}=x^6+x^4+x^3$ is divided by the generating polynomial given by $G(x)=x^3+x^2+1$ to obtain a quotient and a remainder, the source information shift polynomial is given by $N(x)=M(x)\times x^{3"}=x^6+x^4+x^3=(x^3+x^2)(x^3+x^2+1)+x^2$. That is, if the source information shift polynomial $N(x)=M(x)*x^{3"}=x^6+x^4+x^3$ is divided by the generating polynomial $G(x)=x^3+x^2+1$, a remainder of $x^2$ can be calculated.

The remainder of the source information shift polynomial is added to source information as a CRC bit and recorded by PMR (Operation 34). A codeword in which the CRC bit, i.e., the remainder calculated when the source information shift polynomial is divided by the generating polynomial, is added to the source information shift polynomial is recorded by PMR. For example, source information is 1011 and the remainder of the source information shift polynomial is $x^2$. The remainder of the source information shift polynomial is a 3-bit CRC "100". A codeword "1011100" in which the CRC bit "100" is added to the source information "1011" is recorded by PMR.

After Operation 10, a recorded codeword is read, and any error events in the codeword are detected (Operation 12). An error event is generated in a codeword including source information and a CRC bit, or in the boundary between codewords.

An error event detected in a codeword or at a codeword boundary between codewords is at least one of $\pm[2]=[1]$, $\pm[2, -2]=[1, 1]$, $\pm[2, -2, 2]=[1, 1, 1]$, $\pm[2, -2, 2, -2]=[1, 1, 1, 1]$, $\pm[2, -2, 2, -2, 2]=[1, 1, 1, 1, 1]$, $\pm[2, -2, 2, -2, 2, -2]=[1, 1, 1, 1, 1, 1]$, $\pm[2, -2, 2, -2, 2, -2, 2]=[1, 1, 1, 1, 1, 1, 1]$, $\pm[2, -2, 0, 2, -2]=[1, 1, 0, 1, 1]$, $\pm[2, -2, 0, 2, -2, 0, 2, -2]=[1, 1, 0, 1, 1, 0, 1, 1]$, $\pm[2, -2, 0, 0, 2, -2]=[1, 1, 0, 0, 1, 1]$, $\pm[2, -2, 0, 0, 2, -2, 0, 0, 1, 1]$, and $\pm[2, -2, 0, 0, 2, -2, 0, 2, -2]=[1, 1, 0, 0, 1, 1, 0, 1, 1]$. The error events are a collection of dominant error events over a wide range of recording densities and different noise environments in PMR, and are not restricted thereto.

The following Table 1 represents detection capability for dominant error events over a wide range of recording densities and different noise environments in PMR, using $G(x)=x^3+x^2+1$ and $G(x)=x^4+x^3+1$.

TABLE 1

| Dominant error events | Detectability $(1 + x^2 + x^3)$ | Detectability $(1 + x^3 + x^4)$ |
|---|---|---|
| ±[2] | O | O |
| ±[2, -2] | O | O |
| ±[2, -2, 2] | O | O |
| ±[2, -2, 2, -2] | O | O |
| ±[2, -2, 2, -2, 2] | O | O |
| ±[2, -2, 2, -2, 2, -2] | O | O |
| ±[2, -2, 2, -2, 2, -2, 2] | X | O |
| ±[2, -2, 0, 2, -2] | O | O |
| ±[2, -2, 0, 2, -2, 0, 2, -2] | O | O |
| ±[2, -2, 0, 0, 2, -2] | O | O |
| ±[2, -2, 0, 0, 2, -2, 0, 0, 2, -2] | O | O |

Figure 4:
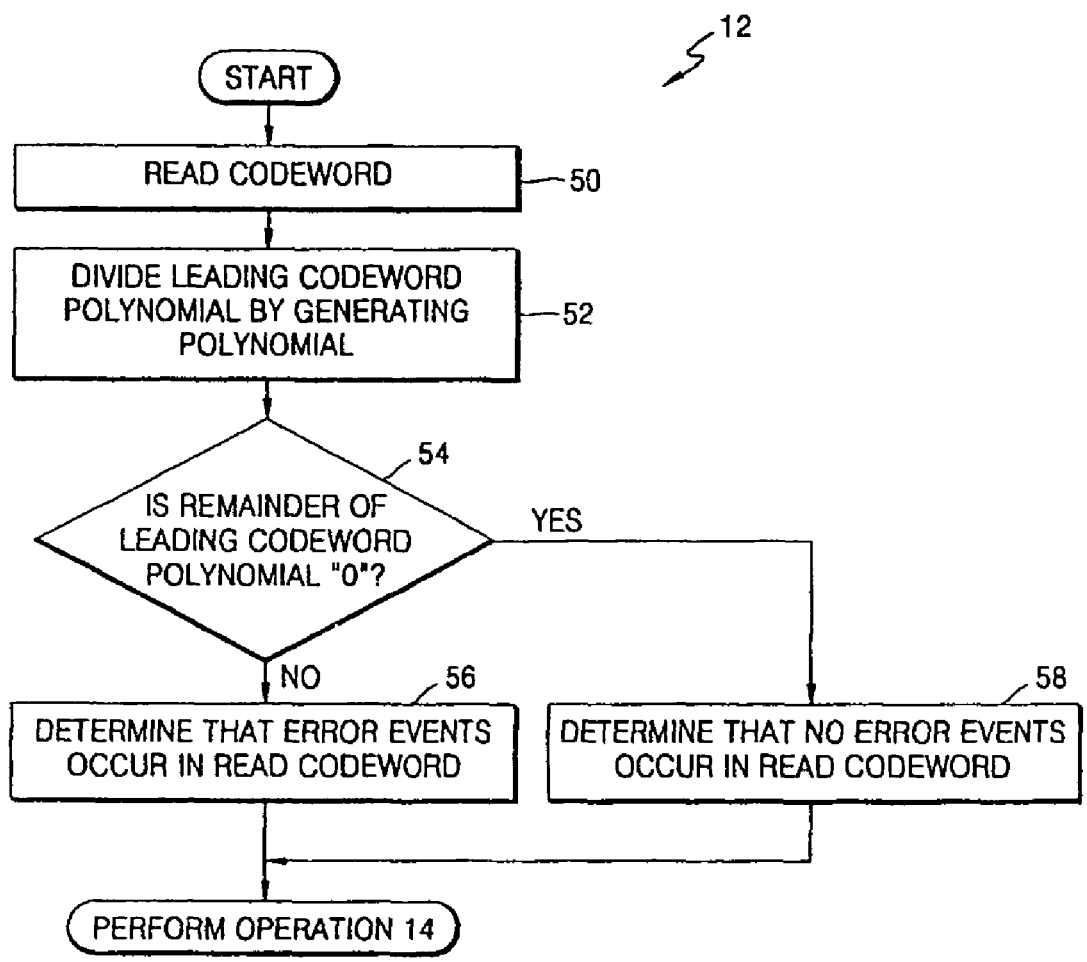
FIG. 4 is a flowchart illustrating Operation 12 shown in FIG. 2.

FIG. 4 is a flowchart illustrating Operation 12 shown in FIG. 2. Referring to FIG. 4, a codeword recorded by PMR is read (Operation 50). For example, the codeword "1011100" corresponding to the CRC bit and the source information is read by PMR.

A leading codeword polynomial having the read codeword as a coefficient is divided by the generating polynomial (Operation 52). The leading codeword polynomial is an equation in which source information corresponding to bit stream information and bit information of a CRC bit are polynomial coefficients. For example, if the codeword is 1011100, the leading codeword polynomial is $D(x)=x^6+x^4+x^3+x^2$. The leading codeword polynomial is divided by the generating polynomial used to implement the CRC code. For example, the leading codeword polynomial is given by $D(x)x^6+x^4+x^3+x^2$ and the generating polynomial is given by $G(x)=x^3+x^2+1$. When the leading codeword polynomial $D(x)$ is divided by the generating polynomial $G(x)$ to obtain a quotient and a remainder, the leading codeword polynomial is given by $D(x)=x^6+x^4+x^3+x^2=(x^3+x^2)(x^3+x^2+1)$. If the read codeword is 1001100, the leading codeword polynomial is given by $D(x)=x^6+x^3+x^2$. For example, the leading codeword polynomial is given by $D(x)=x^6+x^3+x^2$ and the generating polynomial is $G(x)=x^3+x^2+1$. When the leading codeword polynomial $D(x)$ is divided by the generating polynomial $G(x)$ to obtain a quotient and a remainder, the leading codeword polynomial is given by $D(x)=x^6+x^3+x^2=(x^3+x^2+x+1)(x^3+x^2+1)+x^2+x+1$.

When the leading codeword polynomial is divided by the generating polynomial, it is checked whether the remainder of the leading codeword polynomial is 0 (Operation 54).

If the remainder of the leading codeword polynomial is not 0, it is determined that error events have occurred in the read codeword (Operation 56). For example, the leading codeword polynomial is given by $D(x)=x^6+x^3+x^2$ and the generating polynomial is given by $G(x)=x^3+x^2+1$. Since the leading codeword polynomial $D(x)$ is given by $D(x)=x^6+x^3+x^2=(x^3+x^2+x+1)(x^3+x^2+1)+x^2+x+1$, the remainder of the leading codeword polynomial is $x^2+x+1$. Therefore, if the remainder of the leading codeword polynomial is not 0, it is determined that error events have occurred in the read codeword. If source information recorded by PMR is 1011 and a CRC bit added to the source information is 100, the codeword read by PMR must be 1011100. However, if the read codeword is 1001100 due to external noise, it is determined that error events (±[2]=[1]) have occurred in the read codeword.

If the remainder of the leading codeword polynomial is 0, it is determined that error events have not occurred in the read codeword (Operation 58). For example, the leading codeword polynomial is given by $D(x)=x6+x^4+x^3+x^2$ and the generating polynomial is given by $G(x)=x^3+x^2+1$. Since the leading codeword polynomial $D(x)$ is given by $D(x)=x^6+x^4+x^3+x^2=(x^3+x^2)(x^3+x^2+1)$, the remainder of the leading codeword polynomial is 0. Therefore, it is determined that error events have not occurred in the read codeword.

If source information recorded by PMR is 1011 and a CRC bit added to the source information is 100, the codeword read by PMR must be 1011100. However, if the read codeword is 1001100, since an originally recorded codeword is read without error, it is determined that error events have not occurred in the read codeword.

After Operation 12, error events in the read codeword are corrected using an error correction mechanism (Operation 14). For this, a post-Viterbi based error event correlation filter may be used to correct error events in the codeword. The post-Viterbi based error event correlation filter is used to correct error events in a codeword by finding error event locations and error event patterns of the codeword in which the errors occur.

FIG. 5 illustrates an example of the types of error events detected by the present invention. Referring to FIG. 5, a high frequency means a high error rate. It is confirmed that a CRC code having a 3-bit CRC bit is excellent in detecting dominant error events and non-dominant error events in a codeword including source information and the CRC bit or in the boundary between codewords.

FIGS. 6A and 6B illustrate error event detectability according to the CRC code generating polynomial. Referring to FIGS. 6A and 6B, the higher the degree of the generating polynomial, the types of error events are detected more. A higher degree of the generating polynomial results in increasing the number of additional bits used to detect errors, thereby improving the error detection performance.

Figure 7:
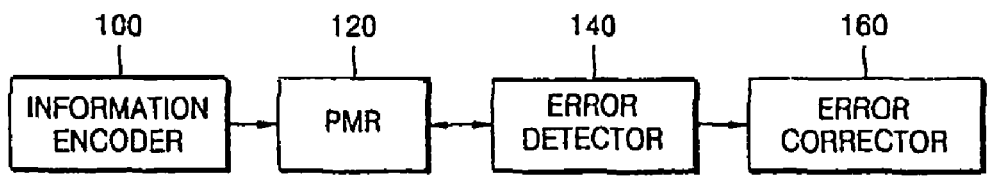
FIG. 7 is a block diagram illustrating an apparatus for detecting error events in a codeword reproduced by PMR according to an exemplary embodiment of the present invention.

FIG. 7 is a block diagram illustrating an apparatus for detecting error events in a codeword reproduced by PMR according to an exemplary embodiment of the present invention. Referring to FIG. 7, the apparatus comprises an information encoder 100, PMR 120, an error detector 140, and an error corrector 160.

The information encoder 100 generates a CRC bit based on source information to be recorded on the PMR 120, and records a codeword in which the generated CRC bit is added to the source information by the PMR 120.

Figure 8:
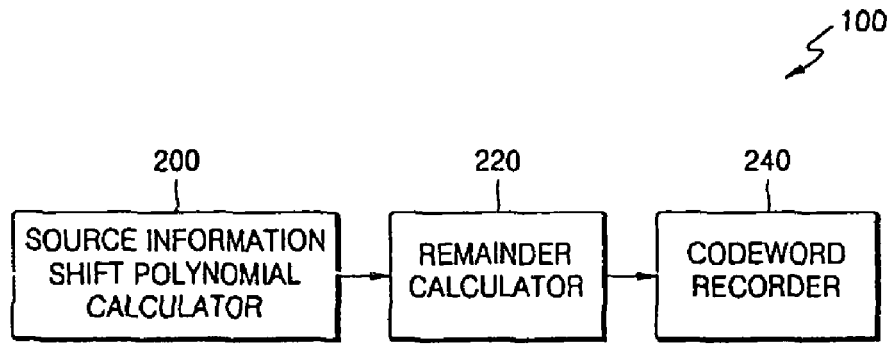
FIG. 8 is a block diagram illustrating an information encoder 100 shown in FIG. 7.

FIG. 8 is a block diagram illustrating the information encoder 100 shown in FIG. 7. The information encoder 100 comprises a source information shift polynomial calculator 200, a remainder calculator 220, and a codeword recorder 240.

The source information shift polynomial calculator 200 calculates a source information shift polynomial to add the CRC bit to the source information, and outputs the calculated polynomial to the remainder calculator 220. The source information shift polynomial is calculated by multiplying the source information by the degree of the generating polynomial.

The remainder calculator 220 receives the source information shift polynomial from the source information shift polynomial calculator 200, divides the source information shift polynomial by the generating polynomial for materializing the CRC code, calculates the remainder of the source information shift polynomial, and outputs the calculated remainder to the codeword recorder 240.

When an error event polynomial having error events as a coefficient is divided by a specific generating polynomial, the remainder calculator 220 uses the specific generating polynomial in which the remainder of the error event polynomial is not 0 as the generating polynomial for implementing the CRC code. Equation 1 or Equation 2 above is used as the generating polynomial.

The codeword recorder 240 records a codeword in which the remainder of the source information polynomial input from the remainder calculator 220 is added to the source information as the CRC bit, by the PMR 120.

The PMR 120 receives the codeword including the source information and the CRC bit from the codeword recorder 240 and records the received codeword on a recording medium. The recorded codeword is output to the error detector 140 to detect error events.

The error detector 140 reads the recorded codeword and detects error events in the codeword. The error detector 140 detects error events in the codeword including the source information and the CRC bit. The error detector 140 detects error events in the boundary between codewords.

An error event detected by the error detector 140 is at least one of ±[2]=[1], ±[2, −2]=[1, 1], ±[2, −2, 2]=[1, 1, 1], ±[2, −2, 2, −2]=[1, 1, 1, 1], ±[2, −2, 2, −2, 2]=[1, 1, 1, 1, 1], ±[2, −2, 2, −2, 2, −2]=[1, 1, 1, 1, 1, 1], ±[2, −2, 2, −2, 2, −2, 2]=[1, 1, 1, 1, 1, 1, 1], ±[2, −2, 0, 2, −2]=[1, 1, 0, 1, 1], ±[2, −2, 0, 2, −2, 0, 2, −2]=[1, 1, 0, 1, 1, 0, 1, 1], ±[2, −2, 0, 0, 2, −2]=[1, 1, 0, 0, 1, 1], ±[2, −2, 0, 0, 2, −2, 0, 0, 2, −2]=[1, 1, 0, 0, 1, 1, 0, 0, 1, 1], and ±[2, −2, 0, 0, 2, −2, 0, 2, −2]=[1, 1, 0, 0, 1, 1, 0, 1, 1]. The error events are a collection of dominant error events over a wide range of recording densities and different noise environments in PMR.

Figure 9:
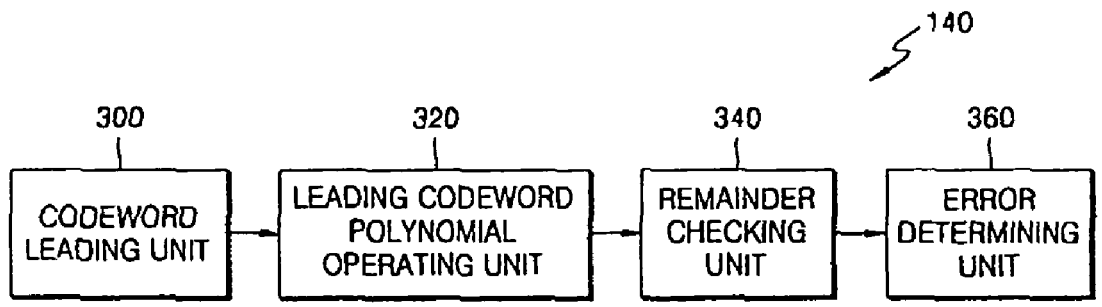
FIG. 9 is a block diagram illustrating an error detector 140 shown in FIG. 7.

FIG. 9 is a block diagram illustrating the error detector 140 shown in FIG. 7. Referring to FIG. 9, the error detector 140 comprises a codeword leading unit 300, a leading codeword polynomial operating unit 320, a remainder checking unit 340, and an error determining unit 360.

The codeword leading unit 300 reads the recorded codeword, and outputs the read codeword to the leading codeword polynomial operating unit 320.

The leading codeword polynomial operating unit 320 receives the codeword from the codeword leading unit 300, calculates a leading codeword polynomial having the received codeword as a coefficient, divides the calculated leading codeword polynomial by the generating polynomial, and outputs the divided leading codeword polynomial to the remainder checking unit 340.

The remainder checking unit 340 receives the leading codeword polynomial output from the leading codeword polynomial operating unit 320, checks whether the remainder of the leading codeword polynomial is 0, and outputs the check result to the error determining unit 360.

The error determining unit 360 determines whether the read codeword contains error events in response to the check result of the remainder checking unit 340.

The error corrector 160 corrects error events in the read codeword using the error correction mechanism, which is a post-Viterbi based error event correlation filter. The error corrector 160 corrects error events in a codeword by finding error event locations and error event patterns of the codeword.

The method of detecting error events in a codeword reproduced by PMR according to an exemplary embodiment of the present invention, and an apparatus using the same, are excellent at detecting error events in a codeword reproduced by PMR.

The method of detecting error events in a codeword reproduced by PMR according to an exemplary embodiment of the present invention, and an apparatus using the same, can detect error events when a codeword recorded by PMR is read using a small number of bits, thereby achieving a high code rate.

The method of detecting error events in a codeword reproduced by PMR according to an exemplary embodiment of the present invention, and an apparatus using the same, can detect error events in a codeword and in the boundary between codewords.

The method of detecting error events in a codeword reproduced by PMR according to an exemplary embodiment of the present invention, and an apparatus using the same, are excellent at detecting dominant error events and non-dominant error events in a codeword reproduced by PMR.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of detecting error events in a codeword reproduced by a perpendicular magnetic recording medium (PMR), the method comprising:
    (a) generating cyclic redundancy check (CRC) parity bits based on a generator polynomial for a source information sequence to be recorded on the PMR and recording a codeword in which the generated CRC parity bits are added to the source information sequence; and
    (b) reading the recorded codeword and detecting an error event in the read codeword,
    wherein (a) comprises:
    (a1) calculating a source information shift polynomial to add the CRC parity bits to the source information sequence;
    (a2) dividing the source information shift polynomial by a generating polynomial of a CRC code and calculating a remainder of the source information shift polynomial; and
    (a3) recording the codeword in which the remainder of the source information shift polynomial is added to the source information sequence as the CRC parity bits,
    wherein in (a2), the generating polynomial used over a wide range of recording densities and different noise environments is expressed as $G(x)=x^3+x^2+1$ or $G(x)=x^4+x^3+1$, and
    wherein $G(x)$ is the generating polynomial to generate a CRC codeword and x is a parameter indicating a 1-bit delay, and
    wherein in (a2), when an error event polynomial having an error event as a coefficient is divided by a specific generating polynomial, a specific generating polynomial in which a remainder of the error event polynomial is not 0 is used as the generating polynomial of the CRC code.

2. The method of claim 1, wherein in (a1), the source information shift polynomial is calculated by multiplying a degree of the generating polynomial by the source information sequence.

3. The method of claim 1, wherein (b) comprises:
    (b1) reading the recorded codeword;
    (b2) dividing a leading codeword polynomial having the read codeword as a coefficient by the generating polynomial;
    (b3) when the leading codeword polynomial is divided by the generating polynomial, checking whether the remainder of the leading codeword polynomial is 0; and
    (b4) determining whether the read codeword contains an error event, wherein:
    if the remainder of the leading codeword polynomial is not 0, the read codeword contains the error event; and
    if the remainder of the leading codeword polynomial is 0, the read codeword does not contain the error event.

4. The method of claim 1, wherein (b) detects whether the read codeword contains the error event.

5. The method of claim 1, wherein operation (b) ensures a detectability of an error event that occurs at a codeword boundary, which is a truncated version of the error event, irrespective of a degree.

6. The method of claim 1, wherein in (b), the detected error event is at least one of $\pm[2]=[1]$, $\pm[2,-2]=[1,1]$, $\pm[2,-2,2]=[1,1,1]$, $\pm[2,-2,2,-2]=[1,1,1,1]$, $\pm[2,-2,2,-2,2]=[1,1,1,1,1]$, $\pm[2,-2,2,-2,2,-2]=[1,1,1,1,1,1]$, $\pm[2,-2,0,2,-2]=[1,1,0,1,1]$, $\pm[2,-2,0,2,-2,0,2,-2]=[1,1,0,1,1,0,1,1]$, $\pm[2,-2,0,0,2,-2]=[1,1,0,0,1,1]$, $\pm[2,-2,0,0,2,-2,0,0,2,-2]=[1,1,0,0,1,1,0,0,1,1]$, and $\pm[2,-2,0,0,2,-2,0,2,-2]=[1,1,0,0,1,1,0,1,1]$.

7. The method of claim 6, wherein in (b), $\pm[2,-2,2,-2,2,-2,2]=[1,1,1,1,1,1,1]$ is the detected error event.

8. The method of claim 1, further comprising:
    (c) after (b), correcting the error event in the read codeword using an error correction mechanism.

9. The method of claim 8, wherein in (c), the error correction mechanism comprises a post-Viterbi processor including a bank of error correlation filters.

10. An apparatus for detecting error events in a codeword reproduced by PMR, the apparatus comprising:
    an information encoder which generates CRC parity bits based on a generator polynomial for a source information sequence to be recorded on PMR medium and records a codeword in which the generated CRC parity bits are added to the source information sequence; and an error detector which reads the recorded codeword and detects error events in the read codeword, wherein the information encoder comprises:

a source information shift polynomial calculator which calculates a source information shift polynomial to add the CRC parity bits to the source information sequence;

a remainder calculator which divides the calculated source information shift polynomial by a generating polynomial of a CRC code and calculates a remainder of the source information shift polynomial; and a codeword recorder which records the codeword in which the remainder of the source information polynomial is added to the source information sequence as the CRC parity bits, wherein the generating polynomial used by the remainder calculator over wide range of recording densities and different noise environments is expressed as $G(x)=x^3+x^2+1$ or $G(x)=x^4+x^3+1$, and wherein $G(x)$ is the generating polynomial to generate a CRC codeword and x is a parameter indicating a 1-bit delay, and wherein when an error event polynomial having error events as a coefficient is divided by a specific generating polynomial, the remainder calculator uses the specific generating polynomial in which a remainder of the error event polynomial is not 0 as the generating polynomial of the CRC code.

11. The apparatus of claim 10, wherein the source information shift polynomial calculator calculates the source information shift polynomial by multiplying a degree of the generating polynomial by the source information sequence.

12. The apparatus of claim 10, wherein the error detector comprises:

a codeword leading unit which reads the recorded codeword;

a leading codeword polynomial operating unit which divides a leading codeword polynomial having the read codeword as a coefficient by the generating polynomial;

a remainder checking unit, when the leading codeword polynomial is divided by the generating polynomial, checked whether the remainder of the leading codeword polynomial is 0; and an error determining unit which determines whether the read codeword contains an error event, in response to the check result of the remainder checking unit.

13. The apparatus of claim 10, wherein the error detector detects whether the read codeword contains the error event.

14. The apparatus of claim 10, wherein the error detector ensures a detectability of an error event that occurs at a codeword boundary, which is a truncated version of the error event, irrespective of the degree.

15. The apparatus of claim 10, wherein the error detector detects at least one of $\pm[2]=[1]$, $\pm[2, -2]=[1, 1]$, $\pm[2, -2, 2]=[1, 1, 1]$, $\pm[2, -2, 2, -2]=[1, 1, 1, 1]$, $\pm[2, -2, 2, -2, 2]=[1, 1, 1, 1, 1]$, $\pm[2, -2, 0, 2, -2]=[1, 1, 0, 1, 1]$, $\pm[2, -2, 0, 2, -2, 0, 2, -2]=[1, 1, 0, 1, 1, 0, 1, 1]$, $\pm[2, -2, 0, 0, 2, -2]=[1, 1, 0, 0, 1, 1]$, $\pm[2, -2, 0, 0, 2, -2, 0, 0, 2, -2]=[1, 1, 0, 0, 1, 1, 0, 0, 1, 1]$, and $\pm[2, -2, 0, 0, 2, -2, 0, 2, -2]=[1, 1, 0, 0, 1, 1, 0, 1, 1]$ as the detected error event.

16. The apparatus of claim 15, wherein the error detector further detects $\pm[2, -2, 2, -2, 2, -2, 2]=[1, 1, 1, 1, 1, 1, 1]$ as the detected error event.

17. The apparatus of claim 16, further comprising an error corrector which corrects the error event in the read codeword using an error correction mechanism.

18. The apparatus of claim 17, wherein the error corrector comprises a post-Viterbi processor including a bank of error correlation filters as the error correction mechanism.

19. The method of claim 5, wherein an error detection capability is guaranteed at the codeword boundary if a truncated version of the error event is not equal to the generator polynomial.

20. The apparatus of claim 14, wherein an error detection capability is guaranteed at the codeword boundary if the truncated version of the error event is not equal to a shifted version of the generator polynomial.

* * * * *